(12) United States Patent
Maliuk et al.

(10) Patent No.: US 9,086,457 B2
(45) Date of Patent: Jul. 21, 2015

(54) SCAN CHAIN LATCH DESIGN THAT IMPROVES TESTABILITY OF INTEGRATED CIRCUITS

(71) Applicant: International Business Machines Corporation, Armonk, NY (US)

(72) Inventors: Dzmitry Maliuk, Addison, TX (US); Franco Stellari, Waldwick, NJ (US); Alan J. Weger, Mohegan Lake, NY (US); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 13/850,555

(22) Filed: Mar. 26, 2013

(65) Prior Publication Data

US 2014/0298128 A1    Oct. 2, 2014

(51) Int. Cl.
*G01R 31/28* (2006.01)
*G01R 31/3185* (2006.01)

(52) U.S. Cl.
CPC ... *G01R 31/318541* (2013.01); *G01R 31/318516* (2013.01); *G01R 31/318519* (2013.01); *G01R 31/318572* (2013.01)

(58) Field of Classification Search
CPC .............................................. G01R 31/318516
USPC ...................................... 714/726, 733, 742
See application file for complete search history.

(56) References Cited

U.S. PATENT DOCUMENTS

| | | | | |
|---|---|---|---|---|
| 5,477,545 | A * | 12/1995 | Huang | 714/727 |
| 5,774,476 | A * | 6/1998 | Pressly et al. | 714/726 |
| 5,889,788 | A * | 3/1999 | Pressly et al. | 714/726 |
| 6,694,464 | B1 * | 2/2004 | Quayle et al. | 714/725 |
| 7,162,673 | B2 * | 1/2007 | Wong | 714/726 |
| 7,188,286 | B2 * | 3/2007 | Dervisoglu et al. | 714/727 |
| 7,653,849 | B1 * | 1/2010 | Tabatabaei | 714/726 |
| 7,779,319 | B1 * | 8/2010 | Tabatabaei | 714/726 |
| 2007/0220383 | A1 | 9/2007 | Kiryu et al. | |
| 2008/0022173 | A1 | 1/2008 | Chua-Eoan et al. | |
| 2008/0077833 | A1 | 3/2008 | Motika et al. | |
| 2010/0321055 | A1 | 12/2010 | Swenton et al. | |
| 2011/0280468 | A1 | 11/2011 | Song et al. | |

FOREIGN PATENT DOCUMENTS

| | | |
|---|---|---|
| CN | 101251580 A | 8/2008 |
| JP | 02005148837 A | 6/2005 |

OTHER PUBLICATIONS

Stellari, F., et al., "On-Chip Power Supply Noise Measurement using Time Resolved Emission (TRE) Waveforms of Light Emission from Off-State Leakage Current (LEOSLC)", IEEE, Nov. 2009.

* cited by examiner

*Primary Examiner* — Esaw Abraham
(74) *Attorney, Agent, or Firm* — Scully, Scott, Murphy & Presser, P.C.; Anne V. Dougherty, Esq.

(57) ABSTRACT

A scan chain latch circuit, a method of operating a latch circuit in a scan chain, and a computer-readable medium having stored thereon a data structure defining a scan chain latch circuit for instantiation on a semiconductor die are disclosed. In an embodiment, the scan chain latch circuit comprises a first latch for holding one data value, a second latch for holding another data value, and a multiplexor. The one data value is applied to a first data input of the multiplexor and the another data value is applied to a second data input of the multiplexor. An alternating clock signal is applied to a select input of the multiplexor to control the output of the multiplexor, wherein the output of the multiplexor toggles between the two data values held in the two latches at a defined frequency.

20 Claims, 5 Drawing Sheets

NEW DESIGN ENABLES

- FAST SINGLE-BIT TOGGLING IN GHz RANGE (CONE OF LOGIC DETECTION, PATH DELAY)

- SKEW ADJUSTMENT B/W SEVERAL LATCHES (TEMPORAL RESOLVABILITY)

- DRASTICALLY REDUCES IMAGE ACQUISITION TIME FOR TRE BY EXCLUDING SCAN CHAIN RELOAD STEP

SCAN CHAIN LATCH DESIGN THAT IMPROVES TESTABILITY OF INTEGRATED CIRCUITS

STATEMENT OF GOVERNMENT INTEREST

This invention was made with Government support under Contract No.: FA8650-11-C-7105 (National Security Agency). The Government has certain rights in this invention.

BACKGROUND

The present invention relates generally to circuit testing, and more particularly to scan chains used for circuit diagnostics.

Modern circuit design incorporates methods and hardware that enable circuit testing upon completion of production, often referred to as "design for test" or "design for testability" (DFT). One DFT technique utilizes scan chains. In a scan chain system, certain latches couple together into a hardware connection known as a "scan chain." The test system inputs a test pattern into the scan chain latches, which the system then uses to test the functionality of the circuit. As such, scan chains allow for increased testability and observability of an integrated circuit design.

Scan chains are widely used in modern IC for rapid test and debug purposes. The recent emergence of emission based test tools imposes additional requirements on scan chains. To extract useful information from emission images, a high degree of control is needed over stimuli applied to a circuit under test. In this respect, functionality of standard scan chains is quite limited.

Other limitations of standard scan chains include the scan chain adjacency problem, and broken/shorted/stuck-at wires. The scan chain adjacency problem is the inability to test certain logic state transitions when adjacent latches feed both inputs of the same 2-input AND, NAND, OR, or NOR gate. A stuck-at fault, which is typically a manufacturing defect, occurs when an input or output of a circuit is stuck at a single logic value.

BRIEF SUMMARY

Embodiments of the invention provide a scan chain latch circuit, a method of operating a latch circuit in a scan chain, and a computer-readable medium having stored thereon a data structure defining a scan chain latch circuit for instantiation on a semiconductor die. In an embodiment, the scan chain latch circuit comprises two latches and a multiplexor. Each of these two latches holds a data value, and each of these data values is applied to a respective one data input of the multiplexor. A clock subcircuit applies an alternating clock signal to a select input of the multiplexor to control the output of the multiplexor so that the output of the multiplexor toggles between the two data values held in the two latches at a defined frequency.

In one embodiment, the output of the multiplexor is an output of the latch circuit.

In an embodiment, the two latches are located in series in the scan chain latch circuit.

In an embodiment, the clock subcircuit applies the clock signal to the select input of the multiplexor at a specified frequency, and said defined frequency is equal to the specified frequency.

In embodiment, the two values held in the latches are different values.

In one embodiment, the scan chain latch circuit has a forward mode of operation and a reverse mode of operation. In the forward mode of operation, a scan-in input is applied to a first of the latches, the data value held in this first latch is applied to the second latch, and this second latch generates a scan-out signal. In the reverse mode of operation, the scan-in signal is applied to the second latch, the data value held on this second latch is applied to the first latch, and the first latch generates the scan-out signal.

In an embodiment, a scan direction signal is applied to the first and second latches to control whether the latch circuit is in the forward mode of operation or the reverse mode of operation.

In an embodiment, the first latch includes a first latch multiplexor, and the scan-in signal and an output of the second latch are applied to the first latch multiplexor. The scan direction signal is applied to the first latch multiplexor to control whether the first latch holds the scan-in signal or the output of the second latch.

In one embodiment, the second latch includes a second latch multiplexor, and the scan-in-reverse input and an output of the first latch are applied to the second latch multiplexor. The scan direction signal is applied to the second latch multiplexor to control whether the second latch holds the scan-in-reverse input or the output of the first latch.

In an embodiment, the second latch includes a scan-inversion multiplexor, and an inverter sub-circuit for applying an inversion of the output of the first latch to this scan-inversion multiplexor. The output of the second multiplexor is also applied to the scan inversion multiplexor. A scan-inversion signal is applied to a select input of the scan-inversion multiplexor to control whether the output of the second multiplexor or the inversion of the output of the first latch is stored in the second latch.

Embodiments of the invention provide a number of important advantages. For instance, embodiments of the invention support bidirectional scan chain operation. This simplifies diagnosis of broken chains and ensures that scan chain retains partial functionality when broken. Embodiments of the invention speed up toggling between two input patterns (in high speed—GHz) without the need to reload the entire scan chain. Embodiments of the invention allow single-bit data toggling (cone of logic detection, path delay estimation) and resolve the latch adjacency problem. In addition, embodiments of the invention introduce skew between inputs, helping separate switching activity of closely located gates, and substantially reduce image acquisition time for Time Resolved Emission (TRE) testing by excluding scan chain reload step.

DETAILED DESCRIPTION

The present invention relates to scan chains used for integrated circuit diagnostics. Scan chains are widely used in modern IC for rapid test and debug purposes. The recent emergence of emission based test tools imposes additional requirements on scan chains. To extract useful information from emission images, a high degree of control is needed over stimuli applied to a circuit under test. In this respect, functionality of standard scan chains is quite limited. For example, to capture a time resolved emission waveform, the same stimulus may have to be applied thousand or even million times. Using standard scan chain, the entire scan chain would have to be reloaded every time the stimulus is reapplied. This results in unacceptably long acquisition time, because the frequency of stimulus exercising is the frequency of scan chain clock (hundreds of MHz) divided by scan chain length.

Other limitations of standard scan chains include the scan chain adjacency problem, and broken/shorted/stuck-at wires. The scan chain adjacency problem is the inability to test certain logic state transitions. Logic testing starts by loading the scan chain with the initial pattern. And this pattern is applied to test the logic by toggling the system clocks. Due to the nature of latch adjacency, certain logic state transitions cannot be generated on the output of one latch while keeping the logic state on the output of other latch. As a result, the possible sequence of test patterns that can be used is limited.

Broken/shorted/stuck-at wires pose a serious threat to standard scan chains rendering them inoperable. However, for test site or prototype IC designs, it would be beneficial to have robust scan chain that would retain partial functionality even when the chain is broken.

Also, standard scan chain lacks in the ability to toggle a single bit while the rest of the bits are not switching. The need of single bit toggling arises in the context of emission testing where single bit toggling reveals a cone of logic affected by this bit. Collecting this kind of information from all the bits within the scan chain one by one could help create a map that would simplify further localization and identification.

Another limitation of standard scan chain is that they do not have any provision to skew toggling times between two bits. All the bits are clocked out by the same scan chain clock. Skew adjustment is a valuable control mechanism for optical diagnosing of ICs. Skew adjustment allows spreading switching activities of closely separated gates in time, thus, improving resolvability.

Figure 1:
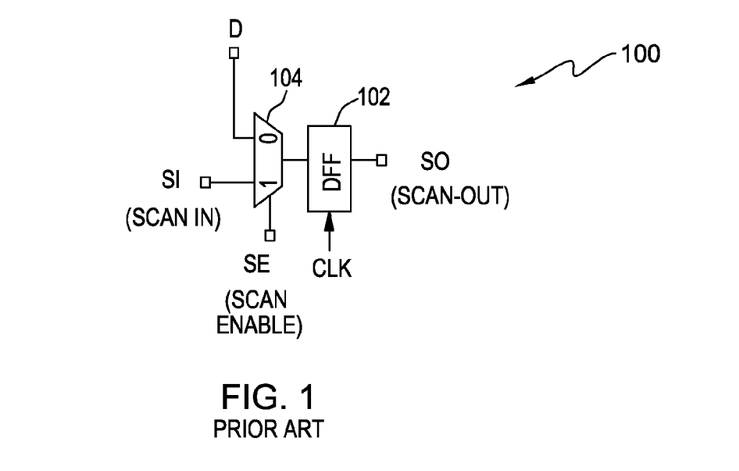
FIG. 1 illustrates a standard prior art latch of a scan chain.

FIG. 1 depicts a prior art latch 100. A "scan chain" is typically comprised of many such latches arranged in a serial fashion. A standard scan chain latch 100 contains a one-bit memory 102 (DFF, or type-D flip flop) and a 2-input multiplexor 104. The SE or scan-enable input allows selection between two modes of operation: on the next edge of the clock (CLK), the memory will store either incoming data D, or the memory may store the state of the neighbor latch as presented on the SI (scan in) input. This ultimately permits the contents of the entire scan chain to be passed outside the chip on a single line which is the SO (scan out) output of the final latch in the chain. Additional descriptions of scan chains and scan chain latches are given in U.S. Pat. Nos. 6,453,436 and 7,774,662, the disclosures of which are hereby incorporated herein by reference.

Figure 2:
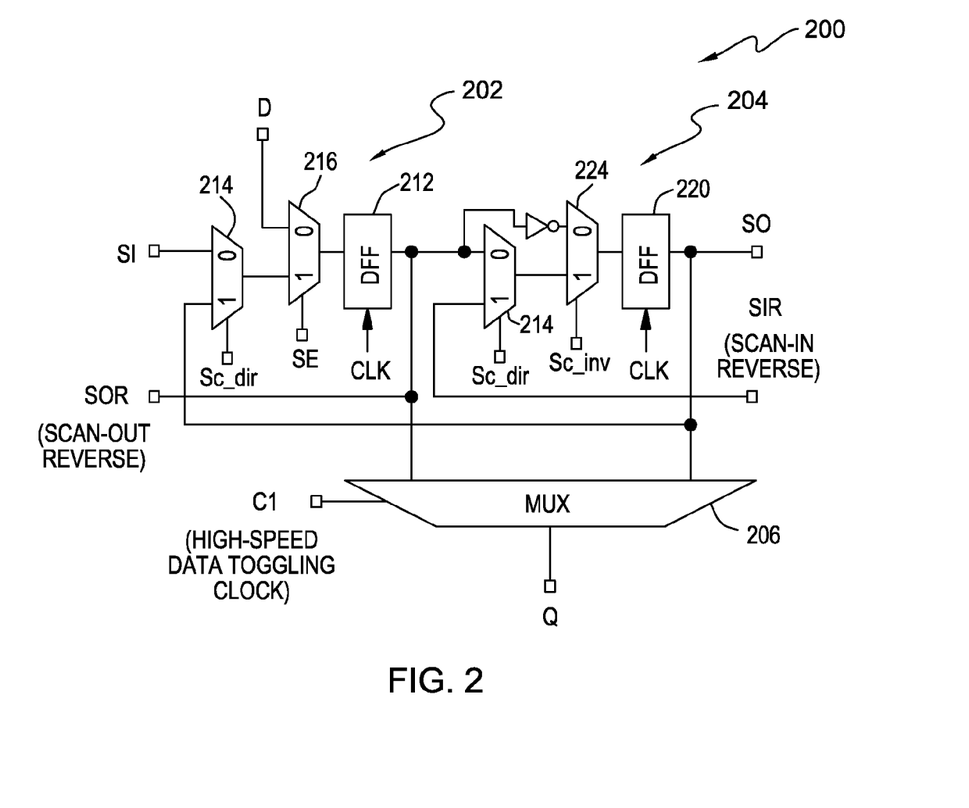
FIG. 2 shows a latch design according to an embodiment of this invention.

FIG. 2 shows a latch design in accordance with an embodiment of this invention. Latch circuit 200 includes a number of unique elements not found in the prior art latch 100. One unique element is a second latch 204, or shadow latch, which may be essentially a copy of the first latch 202 with some extra logic. Another unique element is the MUX 206, which has as its data inputs the outputs of the first and second latches, and as its select input a high speed clock C1. The combination of the first and second latches 202, 204 may be referred to as a superlatch, since from a higher level, the D and SI inputs and the SO output would appear to be identical in function to those of the standard latch, except for the fact that in latch 200, it takes two clock edges for the SO output to propagate vs. one clock edge for the standard latch. The MUX 206 and the extra logic of latch circuit 200 are present to provide the unique features discussed below in more detail.

Latch circuit 200 thus comprises two component latches 202 and 204 and multiplexor 206. Component latch 202 includes a one bit memory 212 and two 2-input multiplexors 214 and 216; and component latch 204 includes a one bit memory 220 and two 2-input multiplexors 222 and 224.

The scan in input is applied to one input of MUX 214, and the output of latch 204 is applied to the other input of MUX 214. The select input of MUX is the scan direction signal. The data D and the output of MUX are input to MUX 216, and the select input of this MUX is the scan enable signal. The output of MUX 216 is applied to memory 212, and the system clock CLK is applied to this memory to control the timing of the data storage in the memory.

The output of memory 212 is applied to a first input of MUX 206, to a first input of MUX 222 and to the Scan-out Reverse (SOR) output of latch circuit 200. The scan-in reverse input from an adjacent latch is applied to the second input of MUX 222, and the select input of this MUX is the scan direction signal.

The output of MUX 222 is applied to one input of MUX 224, and the other input of this MUX 224 is the inversion of the output of memory 212. The select input of this MUX 224 is the scan inversion signal. The output of MUX 224 is applied to memory 220, and the system clock CLK is also applied to this memory to control the timing of the data storage in the memory. The output of memory 220 is the SO output of the latch 200, and this output is also applied to MUX 206 and to MUX 214. The select signal for MUX 206 is the high speed data toggling clock C1.

Latch circuit 200 provides a number of significant features. This embodiment of the invention supports bidirectional scan chain operation, may be used to speed up toggling between two input patterns (GHz) without the need to reload the entire scan chain, and allows single-bit data toggling (cone of logic detection, path delay estimation). This embodiment of the invention also may be used to resolve the latch adjacency problem, to introduce skew between inputs, helping separate switching activity of closely located gates, and to reduce significantly image acquisition time for TRE by excluding scan chain reload step.

Figure 3:
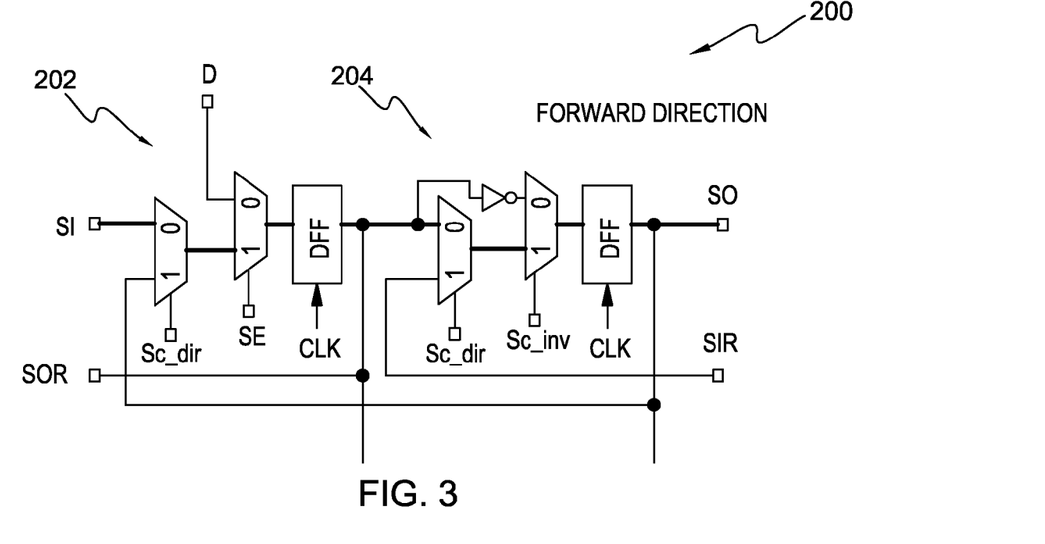
FIG. 3 depicts the operation of the latch of FIG. 2 in a forward direction.
Figure 4:
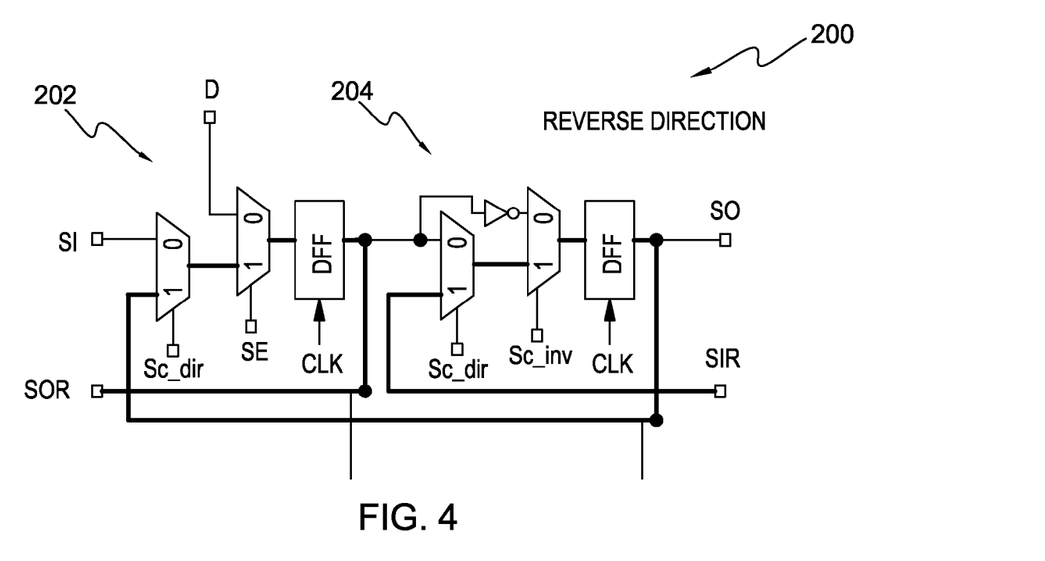
FIG. 4 shows the operation of the latch of FIG. 2 in a reverse direction.
Figure 5:
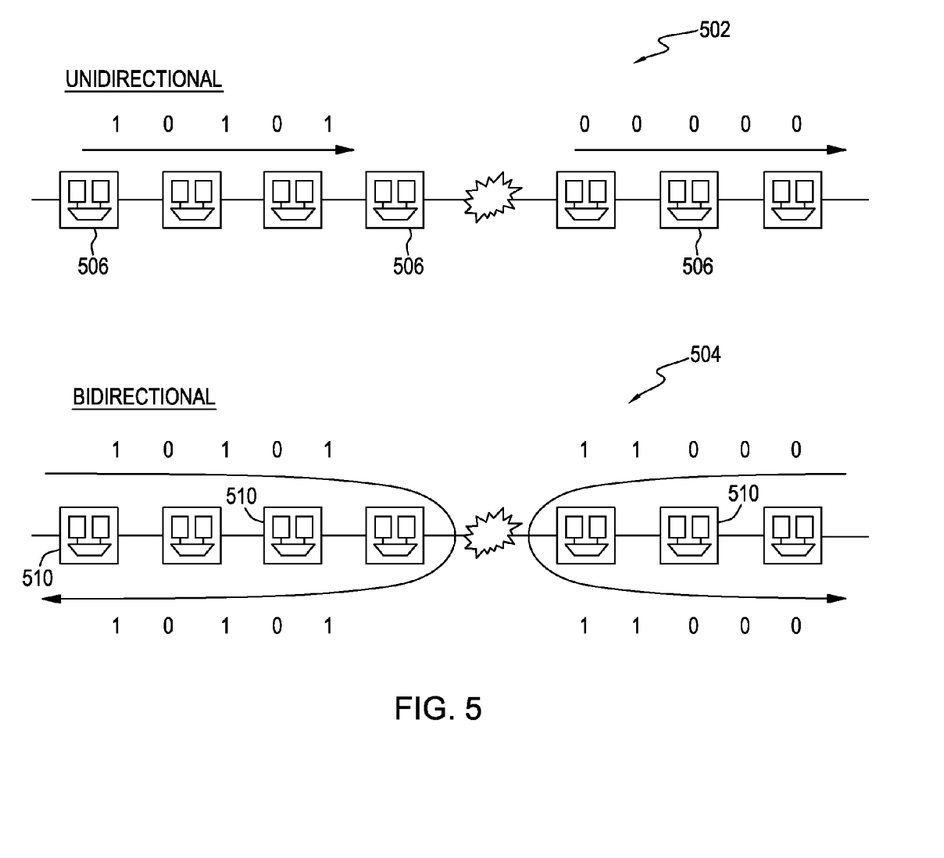
FIG. 5 illustrates unidirectional and bidirectional scans.

FIGS. 3 and 4 depict the bidirectionality feature of the Latch circuit 200. In an ordinary scan chain, data is always passed in one direction to an output. However, there are cases in which—due to design error or circuit malfunction—the data does not successfully reach the output. In these cases, it can be difficult or impossible to identify where the fault lies along the chain. With a bidirectional scan chain, data can proceed along the chain in either direction, as shown in FIG. 5. This allows precise identification of the location of the fault.

The direction of movement of data through latch 200 is controlled by the Sc_dir signal. When this signal is low, as in FIG. 3, the output of component latch 202 is applied to component latch 204, and data moves in the forward direction through latch circuit 200. When the Sc_dir signal is high, as in FIG. 4, the output of component latch 204 is applied to component latch 202, and data moves in the reverse direction through latch circuit 200.

When data moves in the forward direction through latch circuit 200, the latch input is presented on the SI input, and the latch output is presented on the SO output. When data moves in the reverse direction through latch circuit 200, the latch input is presented on the SIR input, and the latch output is presented on the SOR output.

Advantages of this bidirectional movement are illustrated in FIG. 5 which shows two chains 502 and 504 of latches 506 and 510. With unidirectional movement, shown at 502, when a latch is not operating or is broken, the input data is not able to pass through the entire chain, and the chain output may be a series of 0s. Bidirectional movement, shown at 504, may be used to identify the location of the defective latch. Bidirectional movement may also be used to confirm that the other latches in the chain are working properly.

Figure 6:
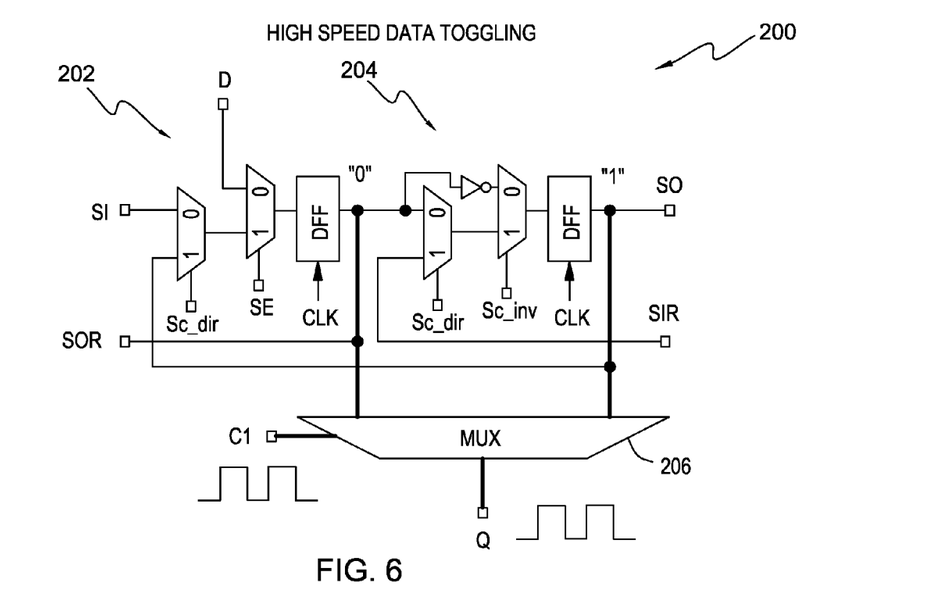
FIG. 6 illustrates high speed data toggling in the latch of FIG. 2

FIG. 6 depicts the High Speed Data Toggling feature of the latch. One deficiency of many standard scan chains is the Latch Adjacency Problem, in which certain logic transitions are unavailable due to the fact the logic is driven by adjacent latches in a scan chain.

In embodiments of the invention, high speed data toggling is achieved through use of the MUX 206 and the high speed data toggling clock C1. As mentioned above, the output of component latch 202 is applied to one input of MUX, and the output of component latch 204 is applied to a second input of the MUS, and clock C1 is applied to the select input of the MUX. As clock C1 alternates between high and low, the output Q of MUX alternates between the output of component latch 202 and the output of component latch 204.

With the example shown in FIG. 6, the output of component latch 202 is 0 and the output of component latch 204 is 1. The output Q of MUX alternates between 0 and 1 under the timing control of Clock C1. With this arrangement, the output of latch 200 can quickly alternate between 0 and 1 without changing any of the data stored in the latch.

Figure 7:
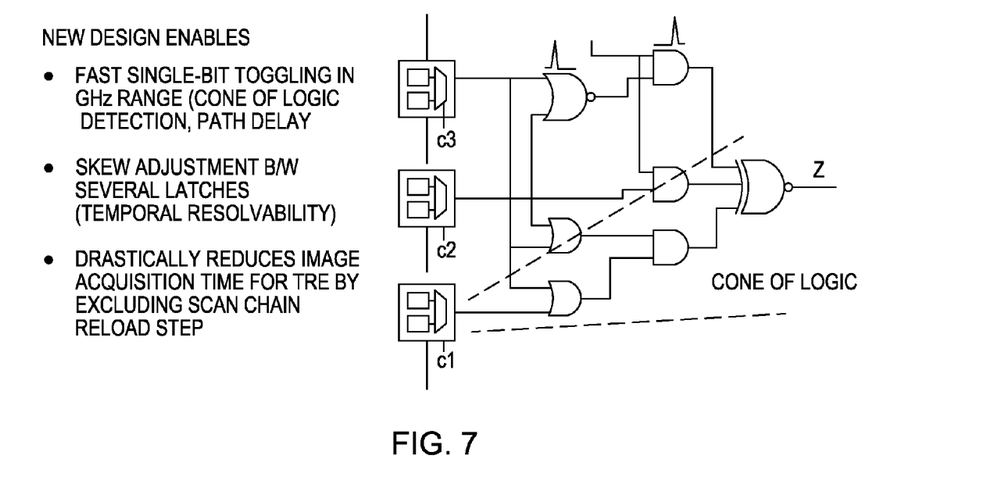
FIG. 7 shows a cone of logic for a latch.

With reference to FIG. 7, latch 200 offers a complete solution to the Latch Adjacency Problem, and in addition, when combined with Emission-based imaging (TRE), has several unique advantages: 1) it permits toggling of a single bit anywhere along the scan chain; 2) it permits direct observation of the cone of logic (or sphere of influence) of a given bit transition; 3) it permits very high speed switching between two arbitrary test patterns (effectively the two test patterns are stored in the two component latches of the superlatch and can be selected with the MUX); 4) through the use of multiple MUX select signals C1, C2, etc., an arbitrary timing skew can be applied between different signal paths; and 5) since two test vectors can be stored at the same time, the image acquisition time for TRE can be substantially reduced by eliminating the overhead of reloading the scan chain.

In an embodiment of the invention, an adjustable skew between several latches (temproal resolvability) can be achieved by providing the output multiplexor of each of a group of superlatches with an independent or otherwise adjustable clock input. For example, the multiplexor 206 of FIG. 2 has a clock C1. In a group of three superlatches, for example, as represented in FIG. 7, the multiplexors of the three superlatches may have clocks C1, C2 and C3 respectively.

Figure 8:
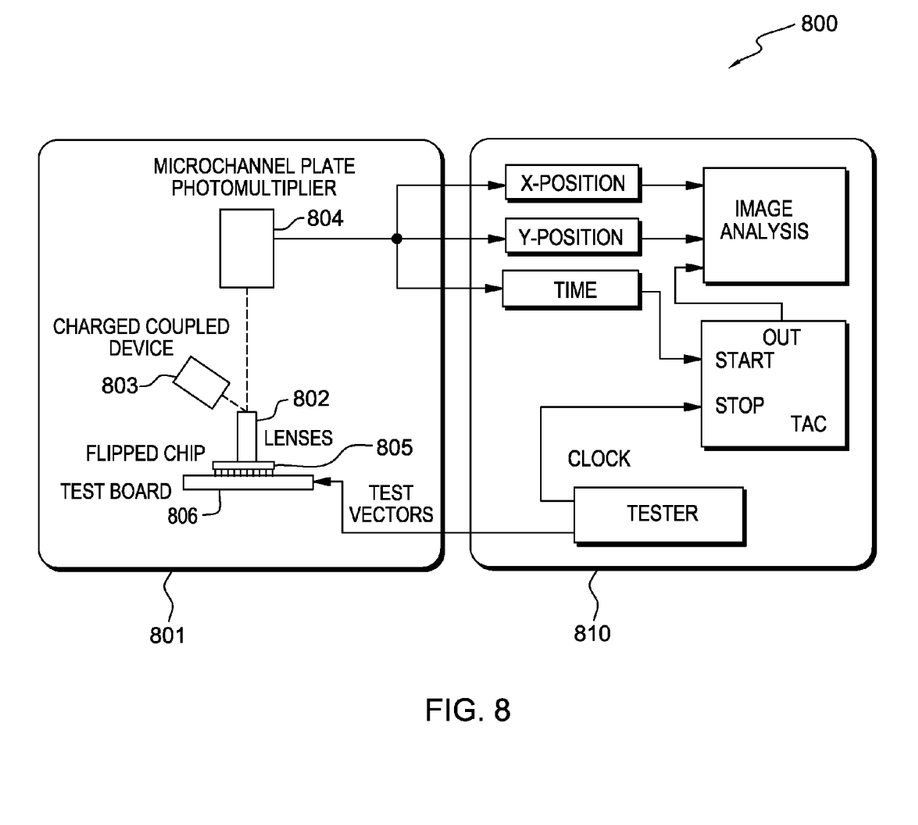
FIG. 8 shows a Picosecond Imaging Circuit Analysis system that may be used to analyze an integrated circuit including scan chains designed in accordance with embodiments of the invention.

Embodiments of the invention address requirements imposed on scan chains by the recent emergence of emission based test tools, and FIG. 8 illustrates, as an example, a Picosecond Imaging Circuit Analysis (PICA) system 800 that may be used to analyze an integrated circuit including scan latches of embodiments of the invention.

The PICA system 800 exemplarily shown in FIG. 8 includes an imaging section 801 with a light-tight enclosure for the components 802, 803, 804 that detect the photon emission for the chip 805 mounted on test board 806. The timing section 810 is used to control the test sequence and analyze the photon emission image.

Thus, in PICA, an automated tester 800 is used to stimulate the packaged device so that the transistors to be studied are switched repetitively. A standard infrared microscope 802, 803 is used to magnify and focus these devices onto the detection apparatus 804, which may be, for example, a thermoelectrically-cooled microchannel-plate (MCP) photomultiplier with a position-sensitive resistive anode, thereby determining both the location and the time of a photon emission.

Additional details of PICA systems are disclosed in "On-Chip Power Supply Noise Measurement using Time Resolved emission (TRE) Waveforms of Light Emission from Off-State Leakage current (LEOSLC)," International Test Conference, Paper 8.1, (IEEE) (2009) (Stellari, et al.) and in U.S. Pat. No. 7,774,662. The disclosures of Stellari, et al. and of U.S. Pat. No. 7,774,662 are hereby incorporated herein by reference in their entireties.

The description of the present invention has been presented for purposes of illustration and description, and is not intended to be exhaustive or to limit the invention in the form disclosed. Many modifications and variations will be apparent to those of ordinary skill in the art without departing from the scope of the invention. The embodiments were chosen and described in order to explain the principles and application of the invention, and to enable others of ordinary skill in the art to understand the invention for various embodiments with various modifications as are suited to the particular use contemplated.

What is claimed is:

1. A scan chain latch circuit comprising:
   a first latch for holding one data value;
   a second latch for holding another data value;
   a multiplexor including first and second data inputs, a select input, and an output, wherein the one data value is applied to the first data input and said another data value is applied to the second data input; and
   a clock sub circuit for applying an alternating clock signal to the select input of the multiplexor to control a value on the output of the multiplexor, wherein the value on the output of the multiplexor toggles between said one data value and said another data value at a defined frequency.

2. The scan chain latch circuit according to claim 1, wherein the output of the multiplexor is an output of the latch circuit.

3. The scan chain latch circuit according to claim 1, wherein the first and second latches are located in series in the scan chain latch circuit.

4. The scan chain latch circuit according to claim 1, wherein the clock subcircuit applies the clock signal to the select input of the multiplexor at a specified frequency, and said defined frequency is equal to the specified frequency.

5. The scan chain latch circuit according to claim 1, wherein the one data value and the another data values are different values.

6. The scan chain latch circuit according to claim 1, wherein:
the scan chain latch circuit has a forward mode of operation and a reverse mode of operation;
in the forward mode of operation, a scan-in signal is applied to the first latch, said one data value is applied to the second latch, and the second latch generates a scan-out signal;
in the reverse mode of operation, the scan-in signal is applied to the second latch, said another data value is applied to the first latch, and the first latch generates the scan-out signal.

7. The scan chain latch circuit according to claim 6, wherein a scan direction signal is applied to the first and second latches to control whether the latch circuit is in the forward mode of operation or the reverse mode of operation.

8. The scan chain latch circuit according to claim 7, wherein:
the first latch includes a first latch multiplexor;
the scan-in signal and an output of the second latch are applied to the first latch multiplexor; and
the scan direction signal is applied to the first latch multiplexor to control whether the first latch holds the scan-in signal or the output of the second latch as the one data value.

9. The scan chain latch circuit according to claim 8, wherein:
the second latch includes a second latch multiplexor;
a scan-in-reverse input and an output of the first latch are applied to the second latch multiplexor; and
the scan direction signal is applied to the second latch multiplexor to control whether the second latch holds the scan-in-reverse input or the output of the first latch as the another data value.

10. The scan chain latch circuit according to claim 9, wherein:
the second latch includes a scan-inversion multiplexor, and an inverter sub-circuit for applying an inversion of the output of the first latch to the scan-inversion multiplexor;
the output of the second latch multiplexor is applied to the scan inversion multiplexor; and
a scan-inversion signal is applied to the scan-inversion multiplexor to control whether the output of the second latch multiplexor or the inversion of the output of the first latch is stored in the second latch.

11. A method of operating a latch circuit in a scan chain in an integrated circuit, the latch circuit including first and second latches, the method comprising:
holding one data value in the first latch;
holding another data value in the second latch;
applying the one data value to a first data input of a multiplexor, and applying said another data value to a second data input of the multiplexor; and
applying an alternating clock signal to a select input of the multiplexor to control an output of the multiplexor, wherein the output of the multiplexor toggles between said one data value and said another data value at a defined frequency.

12. The method according to claim 11, wherein the output of the multiplexor is an output of the latch circuit.

13. The method according to claim 11, wherein the first and second latches are located in series in the latch circuit.

14. The method according to claim 11, further comprising:
at first times, operating the latch circuit in a forward mode of operation;
at second times, operating the latch circuit in a reverse mode of operation; and wherein:
in the forward mode of operation, a scan-in signal is applied to the first latch, said one data value is applied to the second latch, and the second latch generates a scan-out signal;
in the reverse mode of operation, the scan-in signal is applied to the second latch, said another data value is applied to the first latch, and the first latch generates the scan-out signal.

15. The method according to claim 14, wherein
the first latch includes a first latch multiplexor, and the scan-in signal and an output of the second latch are applied to the first latch multiplexor, the second latch includes a second latch multiplexor, and a scan-in-reverse input and an output of the first latch are applied to the second latch multiplexor, and the method further comprises applying a scan direction signal to the first and second latches to control whether the latch circuit is in the forward mode of operation or the reverse mode of operation, including
applying the scan direction signal to the first latch multiplexor to control whether the first latch holds the scan-in signal or the output of the second latch as the one data value, and
applying the scan direction signal to the second latch multiplexor to control whether the second latch holds scan-in-reverse input or the output of the first latch as the another data value.

16. A computer-readable medium having stored thereon a data structure defining a scan chain latch circuit for instantiation on a semiconductor die, the data structure comprising:
first data defining a first latch for holding one data value, and a second latch for holding another data value;
second data defining a multiplexor including first and second data inputs, a select input, and an output wherein the one data value is applied to the first data input and said another data value is applied to the second data input; and
wherein the select input of the multiplexor receives an alternating clock signal to control a value on the output of the multiplexor, and the value on the output of the multiplexor toggles between said one data value and said another data value at a defined frequency.

17. The computer readable medium according to claim 16, wherein the first and second latches are located in series in the scan chain latch circuit.

18. The computer readable medium according to claim 16, wherein:
the scan chain latch circuit has a forward mode of operation and a reverse mode of operation;
in the forward mode of operation, a scan-in signal is applied to the first latch, said one data value is applied to the second latch, and the second latch generates a scan-out signal;
in the reverse mode of operation, the scan-in signal is applied to the second latch, said another data value is applied to the first latch, and the first latch generates the scan-out signal.

19. The computer readable medium according to claim 18, wherein a scan direction signal is applied to the first and second latches to control whether the latch circuit is in the forward mode of operation or the reverse mode of operation.

20. The computer readable medium according to claim 19, wherein:
the first latch includes a first latch multiplexor, the scan-in signal and an output of the second latch are applied to the first latch multiplexor, the second latch includes a second latch multiplexor, a scan-in-reverse input and an output of the first latch are applied to the second latch multiplexor; and the scan direction signal is applied to the first latch multiplexor to control whether the first latch holds the scan-in signal or the output of the second latch as the one data value; and the scan direction signal is applied to the second latch multiplexor to control whether the second latch holds the scan-in-reverse input or the output of the first latch as the another data value.

* * * * *